(12) United States Patent
Yamazaki et al.

(10) Patent No.: US 11,078,123 B2
(45) Date of Patent: Aug. 3, 2021

(54) METAL OXYNITRIDE THIN FILM, PROCESS FOR PRODUCING METAL OXYNITRIDE THIN FILM, AND CAPACITOR ELEMENT

(71) Applicant: TDK CORPORATION, Tokyo (JP)

(72) Inventors: Kumiko Yamazaki, Tokyo (JP); Yuki Nagamine, Tokyo (JP); Takeshi Shibahara, Tokyo (JP); Yuji Umeda, Tokyo (JP); Junichi Yamazaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 105 days.

(21) Appl. No.: 16/185,498

(22) Filed: Nov. 9, 2018

(65) Prior Publication Data

US 2019/0144341 A1 May 16, 2019

(30) Foreign Application Priority Data

Nov. 10, 2017 (JP) .............................. JP2017-217710
Oct. 18, 2018 (JP) .............................. JP2018-196779

(51) Int. Cl.
*C04B 35/58* (2006.01)
*H01G 4/12* (2006.01)
*C23C 14/00* (2006.01)
*C01B 21/082* (2006.01)

(52) U.S. Cl.
CPC .... *C04B 35/58007* (2013.01); *C01B 21/0821* (2013.01); *C04B 35/58* (2013.01);
(Continued)

(58) Field of Classification Search
CPC ........ C04B 35/58007; C04B 2235/768; C01B 21/0821; H01G 4/1254; H01G 4/1227; H01G 4/33
See application file for complete search history.

(56) References Cited

U.S. PATENT DOCUMENTS

| 8,848,336 | B2* | 9/2014 | Koutsaroff | ............... | H01B 3/10 361/321.4 |
| 2006/0045840 | A1* | 3/2006 | Chen | .................... | C01G 25/006 423/598 |
| 2010/0155647 | A1* | 6/2010 | Saito | ..................... | H01L 41/187 252/62.9 PZ |

(Continued)

FOREIGN PATENT DOCUMENTS

| CN | 102858691 A | 1/2013 |
| JP | 2013-001625 A | 1/2013 |
| WO | 2017/027745 A1 | 2/2017 |
| WO | 2017/057745 A1 | 4/2017 |

OTHER PUBLICATIONS

Tobias et al. Anion Ordering and Defect Structure in Ruddlesden-Popper Strontium Niobium Oxynitrides. Inorganic Chemistry, vol. 43, No. 25, 2004.*

(Continued)

*Primary Examiner* — Noah S Wiese
(74) *Attorney, Agent, or Firm* — Oliff PLC

(57) ABSTRACT

A metal oxynitride thin film having a perovskite structure, in which the metal oxynitride thin film has a composition represented by a compositional formula $A_{1+\alpha}BO_{x+\alpha}N_y$, wherein $\alpha$ is larger than zero and 0.300 or less, $x+\alpha$ is larger than 2.450, and y is 0.300 or more and 0.700 or less, an AO structure having a layered structure parallel to a plane perpendicular to a c-axis of the perovskite structure and having a composition represented by a general formula AO, and the AO structure is bonded with the perovskite structure and incorporated in the perovskite structure.

11 Claims, 7 Drawing Sheets

(52) U.S. Cl.
CPC ........ *C04B 35/58014* (2013.01); *C23C 14/00* (2013.01); *H01G 4/1254* (2013.01); *C04B 2235/3208* (2013.01); *C04B 2235/3213* (2013.01); *C04B 2235/3215* (2013.01); *C04B 2235/3224* (2013.01); *C04B 2235/3227* (2013.01); *C04B 2235/3232* (2013.01); *C04B 2235/3251* (2013.01); *C04B 2235/3258* (2013.01); *C04B 2235/46* (2013.01); *C04B 2235/768* (2013.01); *C04B 2235/77* (2013.01); *C04B 2235/95* (2013.01)

(56) References Cited

U.S. PATENT DOCUMENTS

| | | |
|---|---|---|
| 2013/0003254 A1 | 1/2013 | Koutsaroff et al. |
| 2015/0228408 A1 | 8/2015 | Koutsaroff et al. |
| 2016/0271908 A1* | 9/2016 | Izumi .................. C04B 38/0006 |
| 2018/0282229 A1 | 10/2018 | Yamazaki et al. |

OTHER PUBLICATIONS

Maegli et al. Perovskite-type SrTi1xNbx(O,N)3compounds: Synthesis, crystal structureand optical properties. Journal of Solid State Chemistry 184 (2011) 929-936.*

* cited by examiner

1

METAL OXYNITRIDE THIN FILM, PROCESS FOR PRODUCING METAL OXYNITRIDE THIN FILM, AND CAPACITOR ELEMENT

TECHNICAL FIELD

The present invention relates to a metal oxynitride thin film, a process for producing the metal oxynitride thin film and a capacitor element. In particular, it relates to the metal oxynitride thin film having excellent dielectric properties and also having a high specific insulation resistance.

BACKGROUND

Along with an improved performance of digital equipment, dielectrics constituting electronic components utilizing dielectric properties are required to exhibit high Curie temperature (Tc) and high dielectric constant. However, it is difficult to achieve these at the same time. For example, barium titanate exhibiting excellent dielectric properties utilizes structural phase transition to generate its high dielectric constant, and thus Tc is low.

A metal oxynitride having the perovskite structure represented by $SrTaO_2N$ shows a high Tc due to its crystal structure. In addition, since such metal oxynitride does not enhance the dielectric properties by utilizing the structural phase transition, it is said that both a high Tc and a high dielectric constant can be achieved at the same time, but it has not been put to practical use. When nitrogen (N) is introduced into the metal oxide to produce the metal oxynitride, vacancies at the nitrogen (N) site and the oxygen (O) site tend to form. As a result, the insulation properties of the obtained metal oxynitride is lowered, so that it is difficult to produce an insulating material in bulk form, that is, a dielectric material in bulk form.

For example, Patent Document 1 describes a method of producing powder of a metal oxynitride $ABO_2N$ having a perovskite structure. However, in Patent Document 1, although it is described that the powder is formed into a predetermined shape so as to obtain a green compact, there is no disclosure to actually obtain a sintered body by firing the green compact.

On the other hand, Patent Document 2 describes a dielectric thin film made of metal oxynitride having the perovskite structure. This metal oxynitride is represented by the composition formula $A_zBO_xN_y$ (represented by $Ma_zMbO_xN_y$ in Patent Document 2) and x, y, and z in the composition formula are within predetermined ranges. In particular, y indicating the amount of nitrogen in the metal oxynitride is in the range of 0.005 to 0.700 and this range is considerably smaller than the value of y in the stoichiometric composition, that is, one.

Patent Document 1: JP 2013-1625 A
Patent Document 2: WO 2017/057745

SUMMARY

In Patent Document 2, the amount of nitrogen is reduced in the composition formula $A_zBO_xN_y$, while maintaining the perovskite structure to ensure the insulation properties of the thin film. However, the high dielectric properties that the metal oxynitride ($ABO_2N$) having the perovskite structure generates is due to polarization caused by partly replacing O in $ABO_3$ with N, which has stronger covalent bonding property than O. Therefore, if the amount of nitrogen is reduced, it is effective for improving the insulation properties, but there is a problem that dielectric properties such as dielectric constant are lowered.

Therefore, the present inventors calculated electronic states of $SrTaO_2N$ as $ABO_2N$, in which the A site atom is Sr and the B site atom is Ta, based on the first-principles calculation. The crystal structure of $SrTaO_2N$ is shown in FIG. 1. As shown in FIG. 1, $SrTaO_2N$ 10 has a structure where a tantalum atom 13 is located at the center of an octahedron 15 composed of oxygen atoms 11 and nitrogen atoms 12 and a strontium atom 14 is filled in an interstice between the octahedrons 15. From the calculation result of the electronic states, the existence probability of electrons in the crystal structure was drawn as electron clouds. The distribution of the obtained electron clouds is shown in FIG. 2. From FIG. 2, the present inventors paid attention to the fact that the electron cloud tends to be connected between Ta and N.

Since the electronic cloud indicates an existence probability of electrons, the fact that the electron cloud is connected between Ta and N suggests that relatively many electrons tends to be in the bond between Ta and N. Therefore, when a voltage is applied to $SrTaO_2N$, electrons easily move through the bond between Ta and N, that is, electric current flows easily. It is considered that the existence of such an electron transfer pathway in the bond between Ta and N contributes to a decrease in insulation properties.

In order to improve the insulation properties, it is effective to reduce the above-mentioned electron transfer pathway as much as possible. However, in $ABO_2N$, since the site of the anion can be occupied by both oxygen and nitrogen, such as the above-mentioned bond (electron transfer pathway) between the metal and nitrogen is present in an omni-direction (disordered). Therefore, it is inevitable to adopt the method described in Patent Document 2 to reduce such electron transfer pathway, however as mentioned, there is a problem that the dielectric properties such as the dielectric constant is lowered.

The present invention, in view of such circumstances, aims to provide a metal oxynitride thin film with excellent dielectric properties and high insulation properties, a production process of the metal oxynitride thin film, and a capacity element having the metal oxynitride thin film.

The inventors of the present invention have found that the electron transfer pathway can be inhibited in a specific direction by imparting directivity to a part of the electron transfer pathway which is likely to be formed in the bond between metal and nitrogen, that is, by cutting a part of the electron transfer pathway in a specific direction. As a result, when electrons transfer towards the specific direction as described above, it is necessary to pass through a place where the electron transfer pathway is not disconnected. Thereby, it is considered that a detour distance of electrons will be longer and the insulation properties will be improved.

To achieve the above aims, a first aspect of the invention is

[1] A metal oxynitride thin film having a perovskite structure, in which the metal oxynitride thin film has a composition represented by a compositional formula $A_{1+\alpha}BO_{x+\alpha}N_y$ in which $\alpha$ is larger than zero and 0.300 or less, x+a is larger than 2.450, and y is 0.300 or more and 0.700 or less, an AO structure having a layered structure parallel to a plane perpendicular to a c-axis of the perovskite structure and having a composition represented by a general formula AO, and the AO structure is bonded with the perovskite structure and incorporated in the perovskite structure.

[2] The metal oxynitride thin film according to [1], in which the AO structure is scattered in the perovskite structure.

[3] The metal oxynitride thin film according to [1] or [2], in which

A is one or more selected from the group consisting of Ba, Sr, Ca, La, and Nd;

and B is one or more selected from the group consisting of Ta, Nb, W, and Ti

[4] The metal oxynitride thin film according to any one of [1] to [3], in which a product of a relative dielectric constant of the metal oxynitride thin film measured at an electric field strength of 0.5 Vrms/μm and a frequency of 1 kHz and a specific insulation resistance of the metal oxynitride thin film measured at the electric field strength of 0.5 V/μm is $2.0 \times 10^{13}$ Ωcm or more.

To achieve the above aims, a second aspect of the invention is

[5] A process of producing a metal oxynitride thin film including a step of forming the metal oxynitride thin film by depositing a metal oxynitride having a perovskite structure with a use of a film formation material, wherein a raw material, in which a ratio of a molar amount of an A site element of the perovskite structure with respect to a molar amount of a B site element of the perovskite structure is greater than 1.00, is used as the film formation material, a mixed gas including a nitrogen gas and an oxygen gas is used as an atmosphere gas in the step of forming the metal oxynitride thin film, and a ratio of a partial pressure of the oxygen gas with respect to a partial pressure of the nitrogen gas is 0.2 or more.

To achieve the above aims, a third aspect of the invention is

[6] The process of producing the metal oxynitride thin film according to [5], in which the metal oxynitride thin film is the metal oxynitride thin film according to any one of [1] to [4].

[7] A capacitor element including the metal oxynitride thin film according to any one of [1] to [4].

According to the present invention, the metal oxynitride thin film having excellent dielectric properties and the high specific insulation resistance, the process of producing thereof, and the capacitor element including thereof can be provided.

DETAILED DESCRIPTION

Hereinafter, the invention will be described in detail based on specific embodiments in the following order.
1. Thin film capacitor
   1.1. Overall structure of thin film capacitor
   1.2. Metal oxynitride thin film
   1.2.1. Composition of metal oxynitride
   1.2.2. Perovskite structure
   1.2.3. AO structure
2. Process for producing thin film capacitor
   2.1. Process for producing metal oxynitride thin film
   2.1.1. Film formation material
   2.1.2. Film formation step
3. Effect in the present embodiment 1. Thin Film Capacitor In the present embodiment, the thin film capacitor having a metal oxynitride thin film according to the embodiment as a dielectric will be described as an example of the capacitor element. Examples of the capacitor elements other than the thin film capacitor include a thermistor, a filter, a diplexer, a resonator, a transmitter, an antenna, a piezoelectric element, a gate material of a transistor, a ferroelectric memory, etc.

(1.1. Overall Structure of Thin Film Capacitor)

Figure 3:
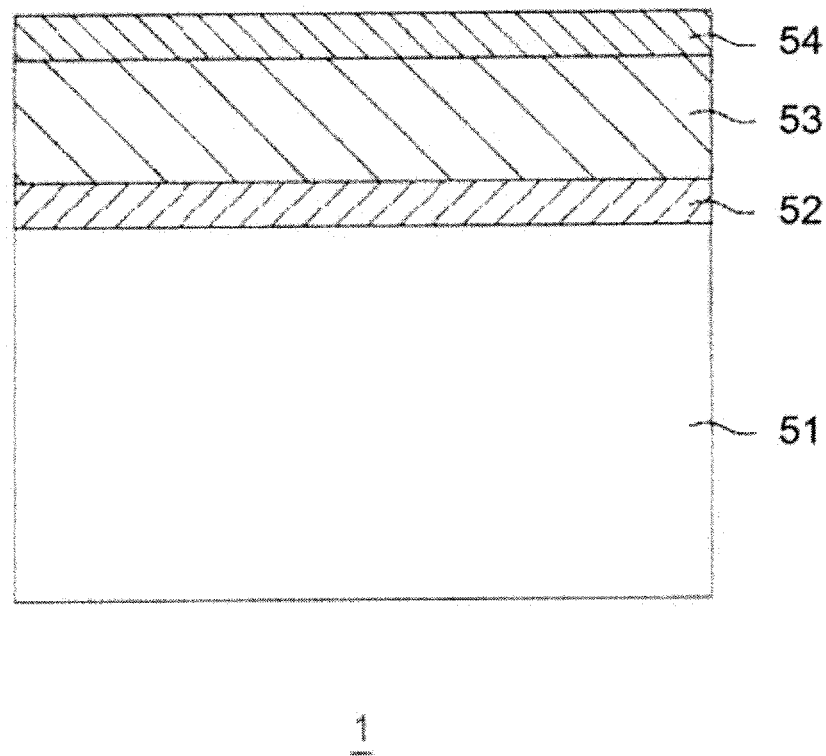
FIG. 3 is a schematic cross-sectional view of a thin film capacitor as an example of the capacitor element according to the present embodiment.

As shown in FIG. 3, the thin film capacitor 1 as an example of the capacitor element according to the present embodiment includes a substrate 51, a lower electrode 52, a metal oxynitride thin film 53, and an upper electrode 54 laminated in this order.

The lower electrode 52, the metal oxynitride thin film 53, and the upper electrode 54 form a capacitor part. When the lower electrode 52 and the upper electrode 54 are connected to an external circuit (not shown) and a voltage is applied, the metal oxynitride thin film 53 which is the dielectric exhibits a predetermined electrostatic capacitance and can function as the capacitor.

The substrate 51 shown in FIG. 3 is not particularly limited if it is made of a material on which the lower electrode 52, the metal oxynitride thin film 53, and the upper electrode 54 are suitably formed. A single crystal, an amorphous material, etc. are exemplified as such material, and it is preferable to use a Si single crystal substrate in the present embodiment.

As shown in FIG. 3, the lower electrode 52 and the upper electrode 54 are formed into thin films and interpose the metal oxynitride thin film 53. The materials of the lower electrode 52 and the upper electrode 54 are not particularly limited if they are materials having conductivity, e.g. metals such as platinum (Pt), ruthenium (Ru), rhodium (Rh), palladium (Pd), iridium (Ir), gold (Au), silver (Ag), copper (Cu), nickel (Ni) or an alloy thereof, etc.

(1.2. Metal Oxynitride Thin Film)

The metal oxynitride thin film according to the present embodiment is composed of the metal oxynitride having a predetermined composition and the perovskite structure as described below.

It is preferable that the metal oxynitride thin film is not constituted by a sintered body obtained by firing a green compact formed by a raw material powder nor a green compact formed by applying a slurry and the like containing the raw material powder, and is a dielectric deposited film of a thin film formed by a well-known thin film formation method. The metal oxynitride thin film of the present embodiment is a crystalline film.

The thickness of the metal oxynitride thin film is not particularly limited and can be set arbitrarily according to desired properties, applications, etc. In the present embodiment, the thickness is preferably 10 nm or more and 2 μm or less.

(1.2.1. Composition of Metal Oxynitride)

The composition of the metal oxynitride constituting the metal oxynitride thin film of the present embodiment is represented by the composition formula $A_{1+\alpha}BO_{x+\alpha}N_y$. A in the composition formula is the A site atom occupying A site of the perovskite structure and the AO structure, and B in the composition formula is the B site atom occupying B site of the perovskite structure.

In the perovskite structure, elements having a relatively large ionic radius such as alkali metal elements, alkaline earth metal elements, lanthanoids, etc. tend to occupy the A site, and elements having a relatively small ionic radius such as transition metal elements, etc. tends to occupy the B site. In the present embodiment, A is preferably one or more selected from the group consisting of Ba, Sr, Ca, La and Nd. Also, B is preferably one or more selected from the group consisting of Ta, Nb, W and Ti. In particular, it is preferable that A is Sr and B is Ta.

As apparent from the composition formula, the metal oxynitride has a composition in which A and O are excessive by α with respect to the composition represented by $ABO_xN_y$. Therefore, it can be said that the above composition formula is a composition in which AO is added in an amount of α to $ABO_xN_y$ having a perovskite structure. Furthermore, under certain condition, an excessive inclusion of A and O causes the formation of the AO structure described below in the metal oxynitride. This AO structure is incorporated into the perovskite structure. In the present embodiment, the certain condition is a film formation condition of a thin film composed of the metal oxynitride. Even when a thin film is formed by adjusting the composition of the metal oxynitride so that the A site component becomes excessive at the time of the film formation under a condition in which O is not excessive, for example, in an atmosphere not introducing O into the chamber, the A site component will be discharged outside the crystal grains. This phenomenon is also a phenomenon corresponding to calculation results by the first-principles calculation. That is, according to the first-principles calculation, it is most stable that vacant sites of O or N in the metal oxynitride are compensated by the loss of the A site component.

$1+\alpha$ in the composition formula is the ratio of an amount of the A site atom with respect to an amount of the B site atom contained in the metal oxynitride. That is, $1+\alpha$ indicates that the A site atoms are contained excessive by α in an amount relative to the B site atoms in the metal oxynitride of the present embodiment.

On the other hand, in the metal oxynitride of the present embodiment, this excessive A site atom and oxygen (O) form the AO structure. Therefore, α indicates contents of the A site atoms and oxygen present in the AO structure in the metal oxynitride. In the present embodiment, α is larger than zero and preferably 0.010 or more. Also, α is preferably 0.300 or less, and more preferably 0.200 or less. If α is excessively large, the AO structure is not incorporated into the perovskite structure and tends to precipitate as a different phase from the perovskite structure, which is not preferable.

In the composition formula, $x+\alpha$ indicates the oxygen content contained in the metal oxynitride. In the present embodiment, $x+\alpha$ is larger than 2.450 and preferably 2.600 or more. Also, $x+\alpha$ is preferably 3.350 or less, and more preferably 2.900 or less. Since α indicates the oxygen content contained in the AO structure as described above, x indicates the oxygen content contained in the perovskite structure. The range of x is determined based on the relation with the below described y.

In the composition formula, y indicates the nitrogen content contained in the metal oxynitride. In the present embodiment, y is 0.700 or less, and preferably 0.600 or less. Also, y is preferably 0.300 or more, and more preferably 0.400 or more. In the present embodiment, it is possible to achieve both high dielectric properties and excellent insulation properties while considerably reducing the nitrogen content to less than one, which is the stoichiometric ratio.

The composition of the metal oxynitride thin film according to the present embodiment can be measured by a well-known method. In the present embodiment, the composition of the metal oxynitride thin film is measured by X-ray photoelectron spectroscopy (XPS). XPS is a surface analysis method for acquiring element information and its bonding state on the sample surface (depth region of several nm from the surface). Thus, in the present embodiment, sputtering which sputters the sample in the depth direction and XPS measurement are performed alternately so as to perform composition analysis including the information inside the sample.

(1.2.2. Perovskite Structure)

Figure 1:
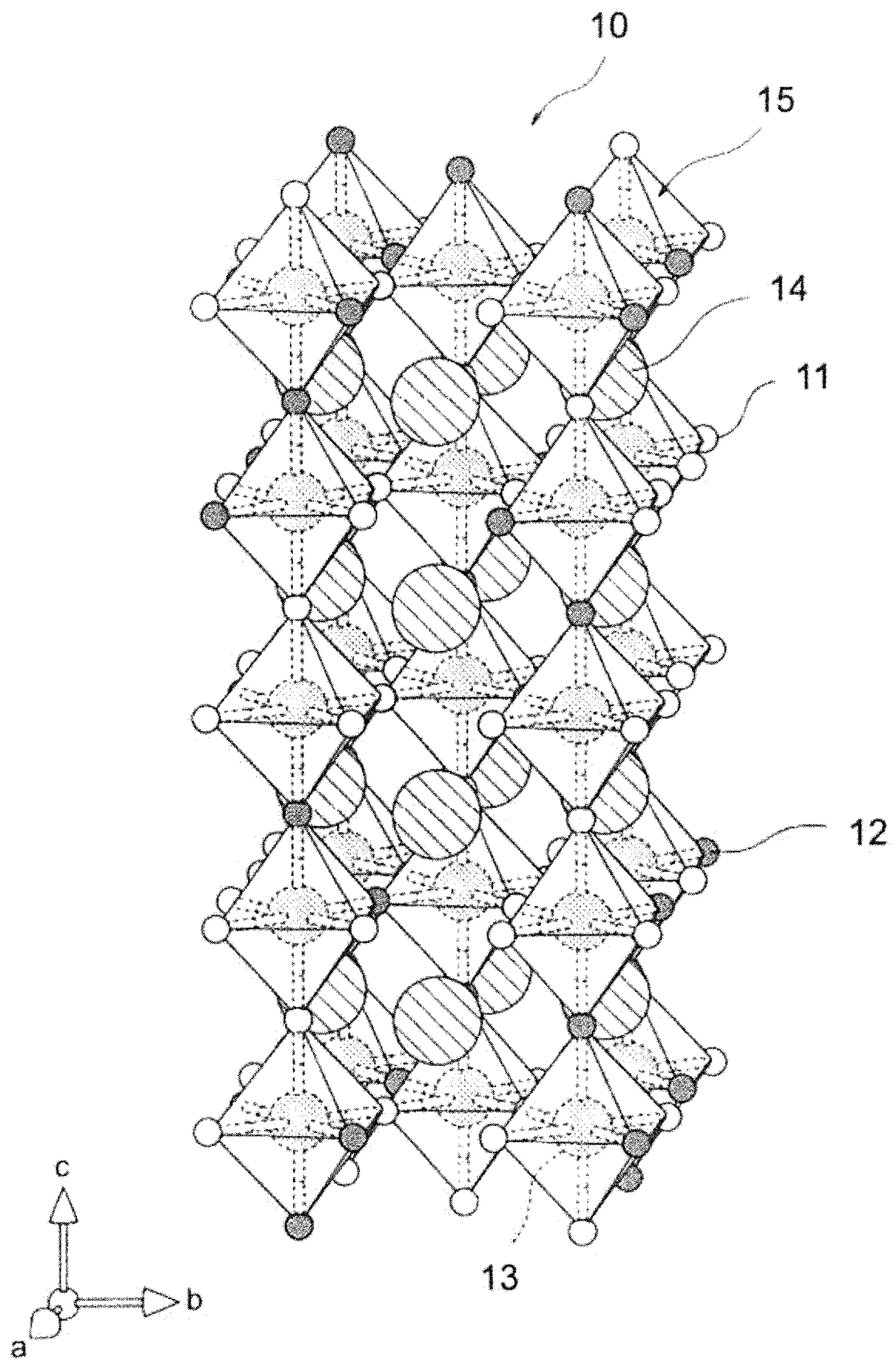
FIG. 1 is a perspective view showing a crystal structure of $SrTaO_2N$.

The metal oxynitride thin film of the present embodiment has a main phase composed of the perovskite structure. As shown in FIG. 1, in the perovskite structure, octahedrons 15 in which anions (11, 12) occupy six vertexes and the B site atom 13 exists in the center share vertexes to form a three-dimensional network. The A site atom 14 is arranged in an interstice of the network. When the composition of the metal oxynitride thin film of the present embodiment is represented by the composition formula $A_{1+\alpha}BO_{x+\alpha}N_y$, each element present in the perovskite structure can be represented by the composition formula $ABO_xN_y$. That is, the amount of O and the amount of N in the perovskite structure are not stoichiometric compositions. Hereinafter, to simplify the explanation, the case where the composition of the perovskite structure is $ABO_2N$, which is out of the range defined in the present embodiment, will be described.

In this case, since the anions are distributed according to the composition ratio of O and N, the above octahedron is a $BO_4N_2$ octahedron. That is, N occupies two vertexes among the six vertexes occupied by the anions in the $BO_4N_2$ octahedron.

Figure 4A:
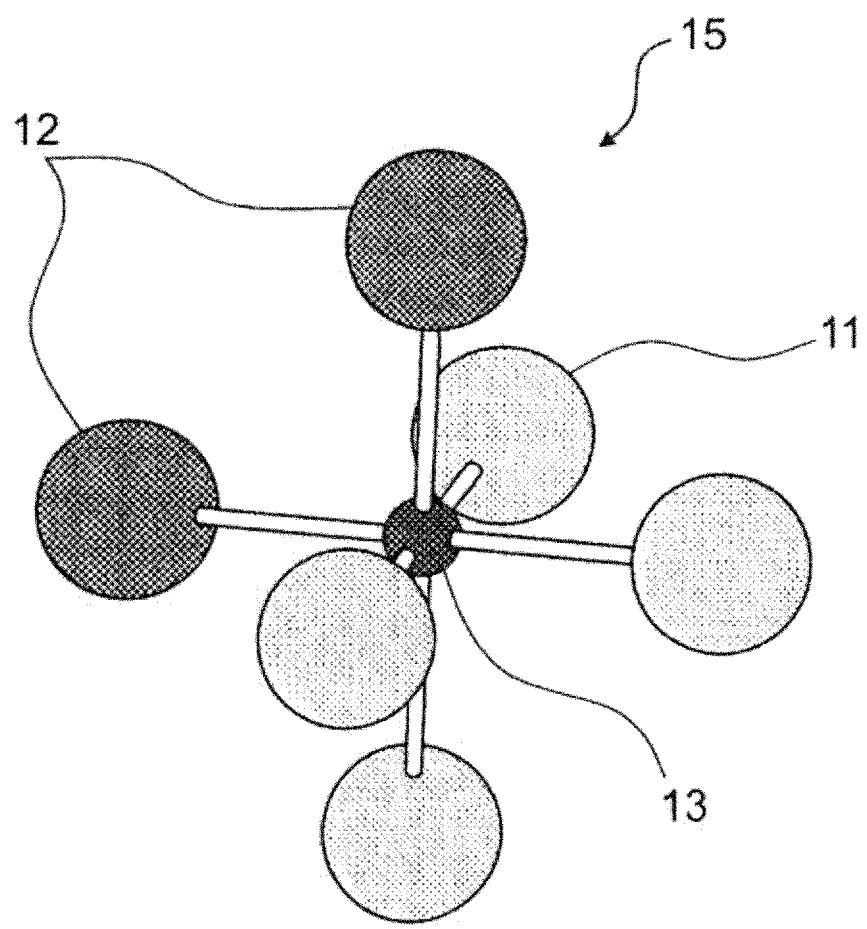
FIG. 4A is a schematic diagram showing a $TaO_4N_2$ octahedron in which N is a cis configuration in $SrTaO_2N$.
Figure 4B:
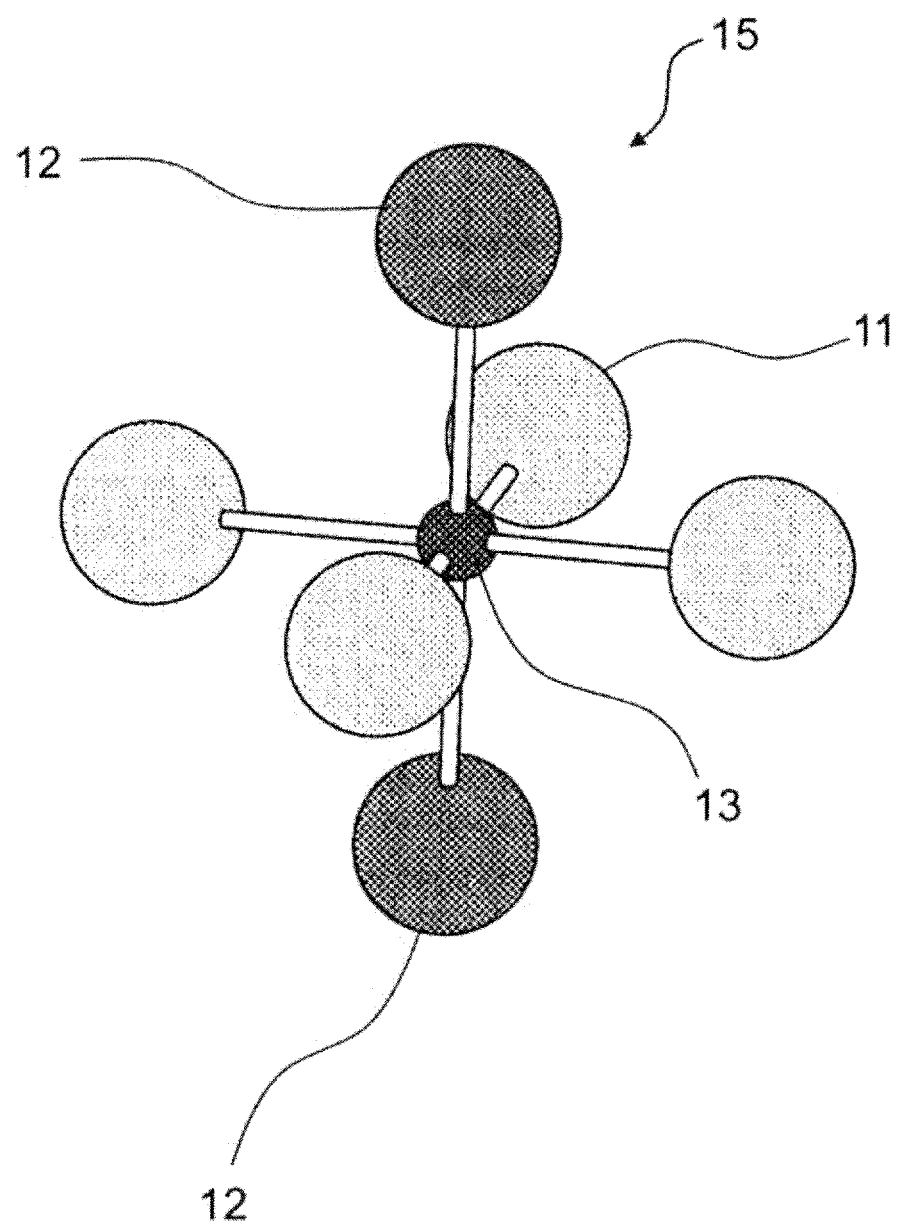
FIG. 4B is a schematic diagram showing the $TaO_4N_2$ octahedron in which N is a trans configuration in $SrTaO_2N$.

Here, in the $BO_4N_2$ octahedron, there are a configuration in which two nitrogens (N) 12 are arranged adjacent to each other (cis configuration) as shown in FIG. 4A and a configuration in which two nitrogens (N) 12 are not adjacent to each other (trans configuration) as shown in FIG. 4B. Since the cis configuration is generally stable in terms of energy, the $BO_4N_2$ octahedron having the trans configuration is hardly present in the entire thin film, and the $BO_4N_2$ octahedron having the cis configuration is dominant. Therefore, also in the present embodiment, for a configuration of N in the $BO_4N_2$ octahedron, the cis configuration is dominant.

When the $BO_4N_2$ octahedron whose N is in the cis configuration share vertexes and are connected in series, the $BO_4N_2$ octahedrons configure the network with inclined from the axis due to the difference between the bonding length between B and O and the bonding length between B and N. It is thought that a local polarization occurs due to such inclination, and due to the polarization, the metal oxynitride having the perovskite structure has excellent dielectric properties.

Figure 2:
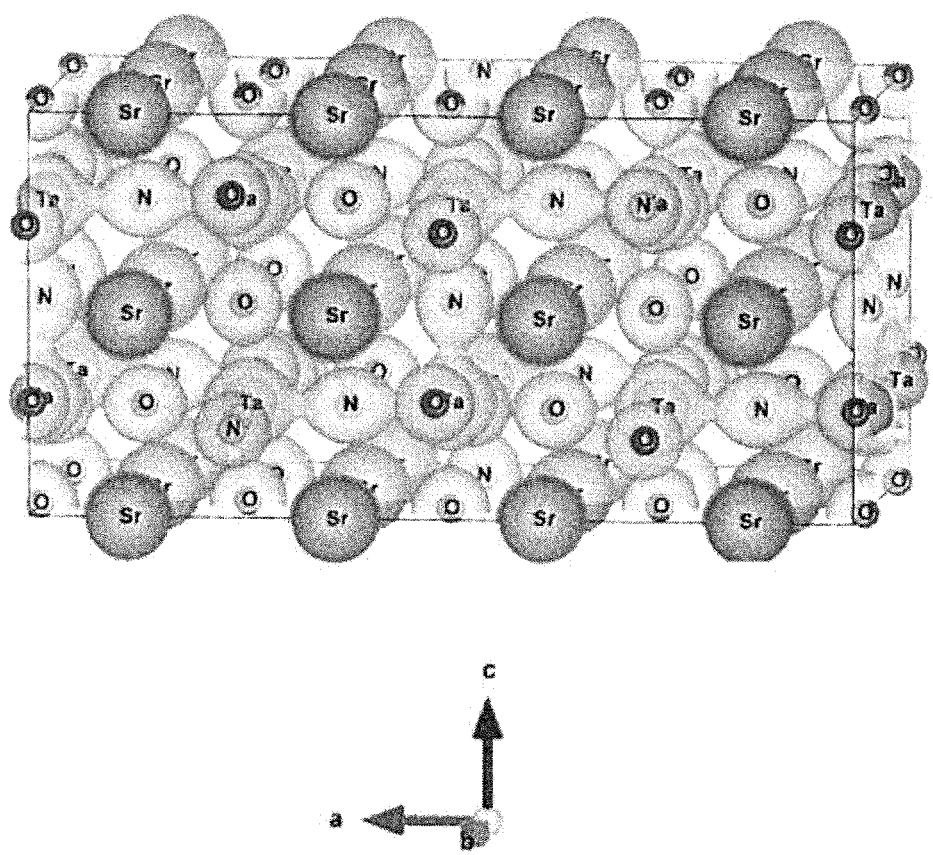
FIG. 2 is a schematic diagram showing a distribution of electron clouds of $SrTaO_2N$ obtained from a calculation result based on the first-principles calculation.

However, when A is Sr and B is Ta, as is clear from the distribution electron clouds of the $SrTaO_2N$ shown in FIG. 2 based on the first-principles calculation, the bond between Ta and N (Ta—N chain) which can be an electron transfer pathway exists in each direction. As a result, when a high voltage is applied to the $SrTaO_2N$ in bulk form, the Ta—N chains conduct each other three-dimensionally, electric current flows easily, and thus excellent insulation properties (the specific insulation resistance) cannot be obtained. Since the dielectric properties are properties assuming that good insulation properties are obtained, that is, the metal oxynitride is a dielectric, a material with low insulation properties cannot be said that it is a dielectric in the first place, and it cannot exhibit excellent dielectric properties. Therefore, in the present embodiment, the AO structure described below is introduced into the perovskite structure to obtain good insulation properties.

(1.2.3. AO Structure)

In the metal oxynitride thin film, the AO structure is bonded with the perovskite structure which is the main phase of the thin film and is incorporated into the perovskite structure. The AO structure is a layered structure of one or more layers in which the layers are parallel to a plane perpendicular to the c axis of a rock salt structure in a compound of the A site atom and oxygen having the rock salt structure.

"Bonded with the perovskite structure and is incorporated into the perovskite structure" means that the AO structure does not exist as a different phase from the phase composed of the perovskite structure, and a perovskite structure incorporating the AO structure is observed as a phase composed of the perovskite structure.

Therefore, when the metal oxynitride thin film of the present embodiment is subjected to X-ray diffraction measurement, diffraction peaks attributed to the perovskite structure are observed, but diffraction peaks attributed to the AO structure are not observed or very small.

Such AO structure is coupled so as to be aligned with the perovskite structure at least in the c-axis direction.

When focusing on the region including the AO structure and a part of the perovskite structure existing near the AO structure, in the case where A is Sr and B is Ta, the region is similar to a crystal structure of a metal oxynitride represented by $Sr_2TaO_3N$.

Figure 5:
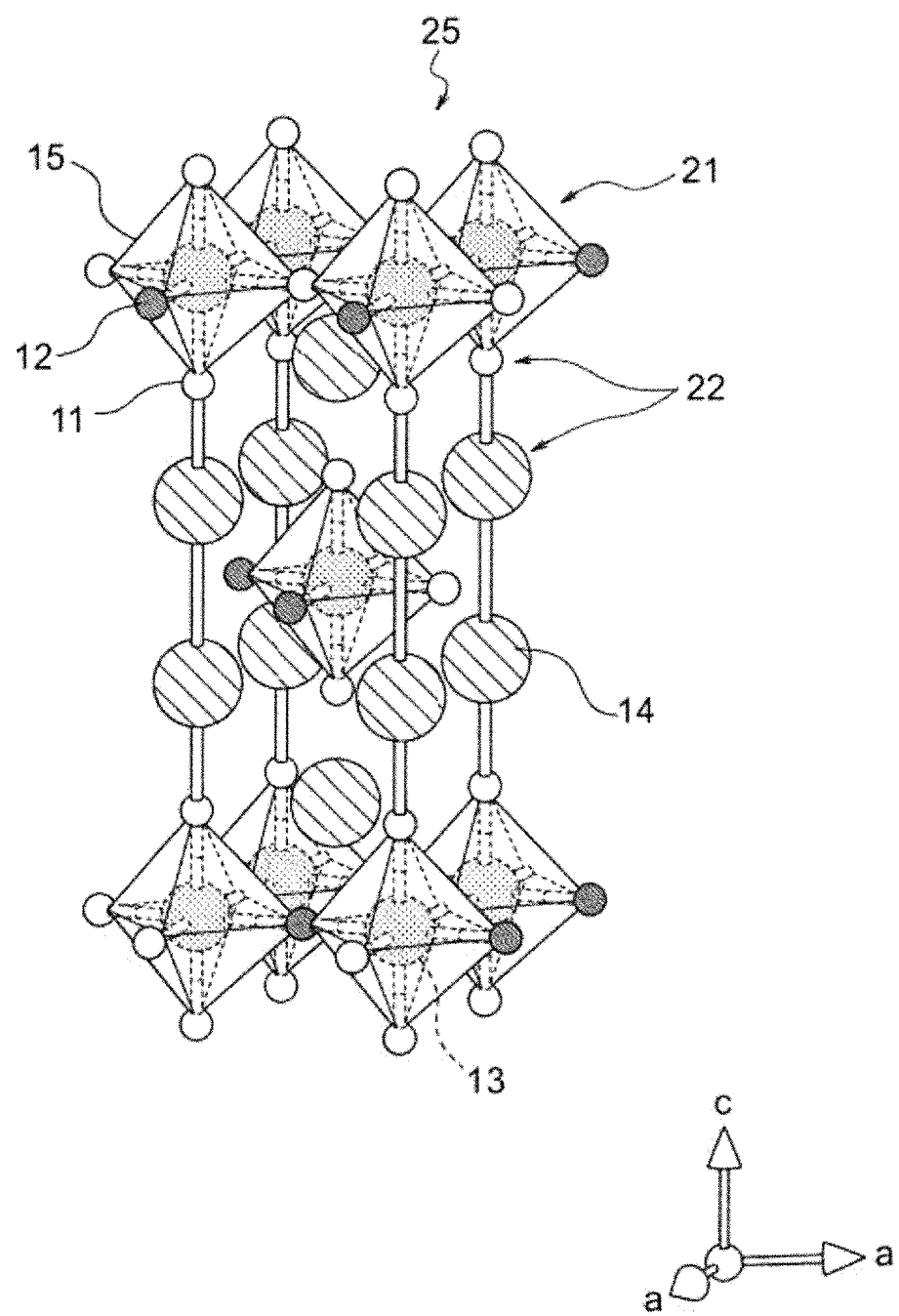
FIG. 5 is a perspective view showing a crystal structure of $Sr_2TaO_3N$.

The crystal structure of $Sr_2TaO_3N$ is shown in FIG. 5. The crystal structure of $Sr_2TaO_3N$ 25 is a $K_2NiF_4$ type structure and has a structure in which an $SrTaO_2N$ layer 21 having the perovskite structure and an SrO layer 22 having the rock salt structure are alternately laminated in the c axis direction. Therefore, it can be said that the AO structure incorporated into the perovskite structure is similar to the SrO layer 22 shown in FIG. 5.

As is apparent from FIG. 5, the SrO layer 22 is a layer not containing N. In addition, the SrO layer 22 is present between the $TaO_4N_2$ octahedron and the $TaO_4N_2$ octahedron both constituting the perovskite structure.

That is, referring to the crystal structure of $Sr_2TaO_3N$ shown in FIG. 5, in the metal oxynitride thin film of the present embodiment, when the AO structure is bonded with the perovskite structure and incorporated in the perovskite structure, the AO structure (SrO Layer) is arranged so as to inhibit the vertex sharing (bonding) between the $TaO_4N_2$ octahedras including the Ta—N chain in the c-axis direction.

Figure 6:
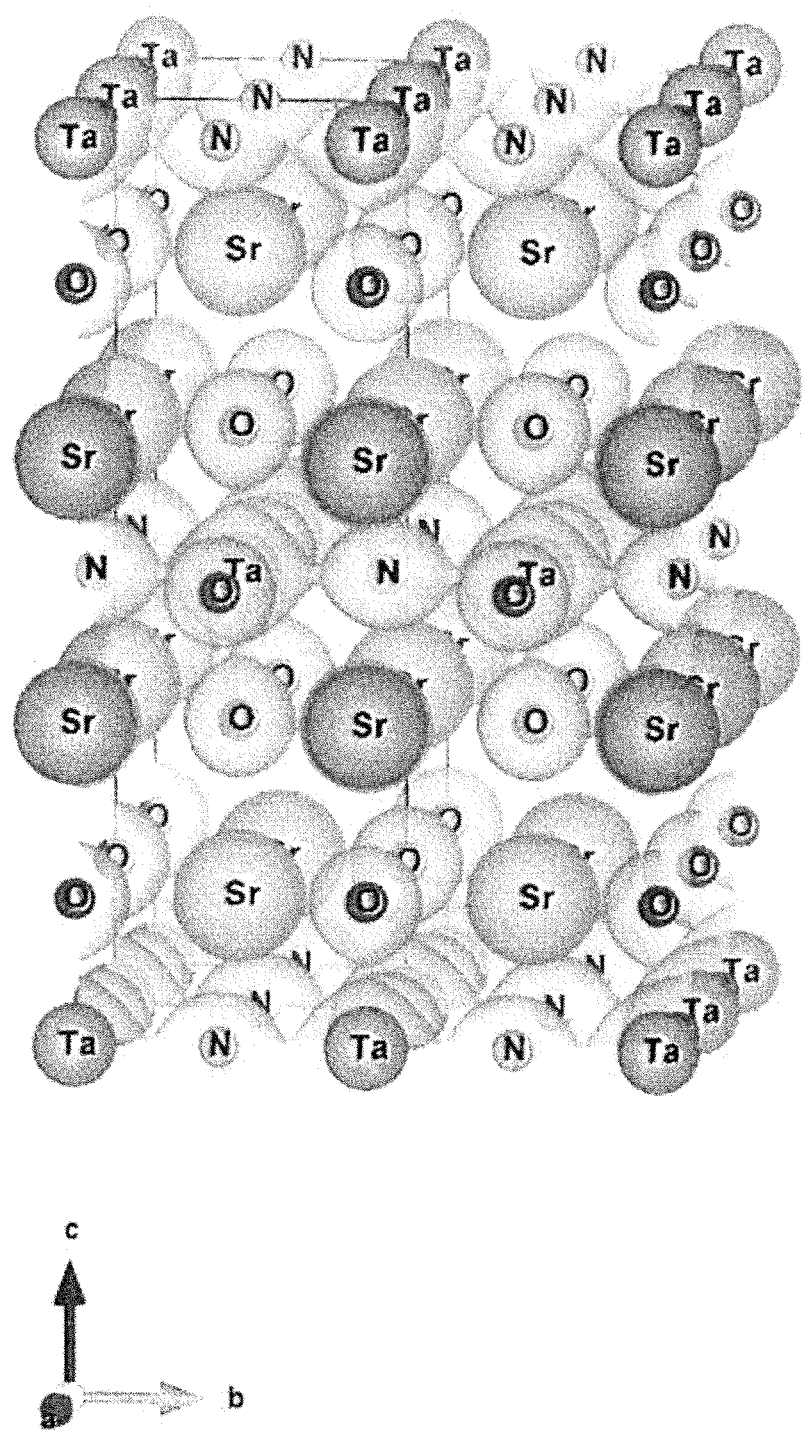
FIG. 6 is a schematic diagram showing a distribution of electronic clouds of $Sr_2TaO_3N$ obtained from a calculation result based on the first-principles calculation.

Here, the electronic states of the $Sr_2TaO_3N$ having the $K_2NiF_4$ type structure is calculated based on the first-principles calculation, and the existence probability of electrons in the crystal structure is drawn as the electron cloud. The distribution of the obtained electron cloud is shown in FIG. 6. As is clear from FIG. 6, there is no overlap of electron clouds which becomes the electron transfer pathway between a plane where the SrO layer is present (a plane parallel to a plane composed of a-axis and b-axis) and the Ta—N chains in the $SrTaO_2N$ existing in the c axis direction of the SrO layer (the vertical direction in FIG. 6). In other words, in the c-axis direction, Ta—N chains that can be the electron transfer pathway is disconnected by the SrO layers.

Therefore, the three-dimensionally extended Ta—N chains are locally disconnected by the SrO layer constituting the AO structure on a plane perpendicular to the c-axis direction. Therefore, it is necessary to detour the SrO layer in order that the Ta—N chains connect again in the c-axis direction to form the electron transfer pathway. The transfer distance of electrons becomes long if the transfer of electrons can be caused to detour, and as a result, the insulation properties of the metal oxynitride can be improved.

As described above, in the perovskite structure, the AO structure is bonded with the perovskite structure and incorporated into the perovskite structure, whereby the insulation properties (the specific insulation resistance) at the time of voltage application is improved. Moreover, instead of reducing the Ta—N chain (reducing the amount of N) responsible for the dielectric properties in all directions, the Ta—N chain in the c-axis direction is locally disconnected. Thus, the dielectric properties are maintained relatively well, and the insulation properties can be improved. In the present embodiment, the metal oxynitride thin film having the above structure preferably has a product of a relative dielectric constant and a specific insulation resistance of $2.0 \times 10^{13}$ Ωcm or more. Specifically, the metal oxynitride thin film preferably has, at a frequency of 1 kHz, a product of the relative dielectric constant calculated from the electrostatic capacitance obtained when applying an AC voltage such that an electric field strength becomes 0.5 Vrms/μm and the specific insulation resistance obtained when applying a DC voltage such that the electric field strength becomes 0.5 V/μm is preferably $2.0 \times 10^{13}$ Ωcm or more.

As described above, in the metal oxynitride thin film of the present embodiment, the Ta—N chain which can be the electron transfer pathway is physically disconnected by inserting the AO structure. Therefore, even when the voltage applied to the metal oxynitride thin film becomes high and the amount of electron transfer in the Ta—N chain increases, the effect of the AO structure to inhibit the movement of electrons in the c-axis direction does not change much. As a result, even if the electric field strength is increased, a decrease in the insulation properties is suppressed, and a high specific insulation resistance can be maintained.

In the present embodiment, it is preferable that the AO structures are scattered in a direction parallel to the c-axis of the perovskite structure and the c-axis of the AO structure. A plurality of the AO structures are preferably scattered in the perovskite structure than a plurality of the AO structures are locally scattered, thereby the disconnection of the Ta—N chain tends to generate over the entire perovskite structure, so that the transfer distance of electrons can be increased over the entire perovskite structure. As a result, the specific insulation resistance can be efficiently improved.

Whether or not the AO structure is bonded with the perovskite structure and incorporated into the perovskite structure can be confirmed, for example, by observing the metal oxynitride thin film by TEM.

2. Process for Producing Thin Film Capacitor

Next, an example of a process for producing the thin film capacitor 1 shown in FIG. 1 will be described below.

First, the substrate 51 is prepared. For example, when a Si single crystal substrate is used as the substrate 51, an insulating layer (e.g. $SiO_2$) is formed on one main surface of the substrate. As a method for forming the insulating layer, a well-known film formation method such as a thermal oxidation method, a Chemical Vapor Deposition (CVD) method, etc. may be used.

Subsequently, a thin film of a material constituting the lower electrode is formed on the formed insulating layer by a well-known film formation method such as a sputtering method to form the lower electrode 52.

(2.1. Process for Producing Metal Oxynitride Thin Film)

Subsequently, the metal oxynitride thin film 53 is formed on the lower electrode 52 by using a well-known film formation method. In the present embodiment, a metal oxynitride thin film having the above-described perovskite structure and AO structure can be easily formed by forming the film with adopting the conditions described later. In other words, even if the A site element and oxygen are excessively contained in the $ABO_xN_y$ by α so that the metal oxynitride has a composition represented by $A_{1+\alpha}BO_{x+\alpha}N_y$, the AO structure is not easily formed.

A well-known film formation method includes, for example, a vacuum deposition method, a sputtering method, a pulsed laser deposition (PLD) method, a metal-organic chemical vapor deposition (MOCVD) method, a Metal Organic Decomposition (MOD) method, a sol-gel method, a chemical solution deposition (CSD) method, etc.

Among these film forming methods, a well-known vapor phase growth method in which the film forming is performed by depositing the film formation material on a substrate after performing a separation or an excitation of the film forming raw material to an atomic level or molecular level once is preferable. Hereinafter, a method of film forming the metal oxynitride thin film by using the PLD method will be described as the vapor phase growth method.

According to the PLD method, a target including constituent elements of a thin film to be formed is placed in a film forming chamber, and a pulsed laser is irradiated on the target surface. Strong energy by irradiation instantaneously evaporates the target surface to generate a plume and the evaporated substance is deposited on the substrate facing the target to form a thin film.

(2.1.1. Film Formation Material)

Various target materials, vapor deposition materials, organometallic materials, etc. are exemplified as the film formation materials for. When a metal oxynitride thin film is formed by using the PLD method, a target having a predetermined composition is used as a film formation material.

In the present embodiment, a target having a composition with a ratio of the molar amount of the A site element (e.g. Sr) with respect to the molar amount of the B site element (e.g. Ta) in the perovskite structure of greater than 1.00 is used. That is, it is a target in which the A site element is excessively contained relative to the B site element.

By using the target having such composition, it becomes easy to form the metal oxynitride thin film having the perovskite structure and the AO structure described above.

Note that the ratio of the molar amount of the A site element with respect to the same of the B site element in the target does not necessarily correspond to the ratio of the molar amount of the A site element with respect to the same of the B site element in the metal oxynitride thin film obtained by film formation. This is believed due to the fact that the ratio of each element separated from the target during the film formation and the ratio of each element incorporated into the thin film are different.

When the ratio of the molar amount of the A site element with respect to the same of the B site element is within the above range, an oxide, a nitride, an oxynitride, an alloy, etc. can be used as the target. In addition, there are cases where trace amounts of impurities and subcomponents are contained in the film formation material, but this is not a problem unless it significantly deteriorates the effect of the present invention.

(2.1.2. Film Formation Step)

In the step of forming the metal oxynitride thin film, first, in order to partly expose the lower electrode, a region where the metal oxynitride thin film is not formed is formed on the lower electrode by using a metal mask.

In the present embodiment, to crystallize the thin film, it is preferable to heat the substrate with an infrared laser during the film formation. The substrate temperature during the film formation may be determined according to the constituent elements, composition, etc. of the thin film, but in view of easy introduction of the AO structure, it is preferably 1000° C. or less. Further, in the present embodiment, substrate temperature is preferably within the range of 600° C. to 800° C. When the substrate temperature is excessively low, the thin film tends not to be crystallized. When the substrate temperature is too high, cracks or the like tend to occur due to a difference in thermal expansion between the substrate and the thin film when cooling.

When an oxide is used as the target, the atmosphere gas in the step of film forming at least contains oxygen gas and nitrogen gas. By using such atmosphere gas, the insulation property of the obtained thin film is secured, and a thin film as the dielectric can be obtained. In particular, according to the present embodiment, $pO_2/pN_2$, which is the ratio of the partial pressure of oxygen gas ($pO_2$) with respect to the same of nitrogen gas ($pN_2$), is set to 0.2 or more in order to introduce the AO structure into the perovskite structure.

Normally, when a metal oxynitride thin film is formed by using the oxide target, it is necessary to introduce nitrogen when the target is evaporated and deposited on the substrate. Thus, $pN_2$ is made much larger than $pO_2$. On the contrary, $pO_2$ is made relatively large with respect to $pN_2$ according to the present embodiment.

$pO_2/pN_2$ is preferably 1.0 or more, more preferably 2.0 or more. The preferable range of $pO_2/pN_2$ varies depending on the film formation method. For example, it is preferable that $pO_2/pN_2$ is relatively large when adopting the PLD method, while the above-described structure is easily obtained even if $pO_2/pN_2$ is relatively small when adopting the sputtering method.

Further, in the present embodiment, at the time of film formation, the metal oxynitride may be directly formed on the substrate without forming a metal oxide thin film. The metal oxide thin film may also be formed, and then nitrogen may be introduced into the formed metal oxide thin film to obtain the metal oxynitride thin film. In either case, as the nitriding treatment, a method of introducing nitrogen radicals into the film formation chamber when forming the metal oxide film, a method of using a reactive sputtering using nitrogen gas, a method of using nitrogen activated by a plasma nitriding, etc. can be used.

According to the method above, the metal oxynitride thin film can be formed without using a toxic gas, which is preferable. It is also possible to use a partial oxidation treatment of the metal nitride thin film or the like. According to the present embodiment, it is preferable to introduce nitrogen used for the nitriding to obtain the metal oxynitride at the time of film formation using a metal oxide raw material.

In the case where the nitrogen content (y) in the metal oxynitride thin film is small, a metal oxide thin film is formed using a target composed of an oxide, and then the nitriding treatment may be performed by introducing nitrogen radicals to the metal oxide thin film.

The metal oxynitride thin film thus obtained is the deposited film which functions as the dielectric.

Next, in the present embodiment, a thin film of a material constituting the upper electrode is formed on the formed metal oxynitride thin film 53 by using a well-known film formation method to form the upper electrode 54.

Through the above steps, as shown in FIG. 1, the thin film capacitor 1 having the capacitor part, lower electrode 52, metal oxynitride thin film 53 and upper electrode 54, formed on the substrate 51 is obtained.

3. Effect in the Present Embodiment

According to the present embodiment, the metal oxynitride having a predetermined composition excessively contains the A site element and oxygen and incorporates the AO structure formed from the A site element and oxygen. This AO structure is bonded with the perovskite structure in the perovskite structure which is the main phase of the metal oxynitride thin film.

In addition, the AO structure has a layer not containing nitrogen in a plane perpendicular to the c-axis. The electron cloud of bonds between the atoms constituting the layer not containing nitrogen does not overlap the electron cloud of the bond between the B site atom and nitrogen existing in the c-axis direction of the layer. Therefore, the electron does not transfer between the layer not containing nitrogen and the bond between the B site atom and nitrogen.

As a result, by incorporating the AO structure into the perovskite structure, even if the bonds of the B site atoms and nitrogen, which can be the electron transfer pathways when voltage is applied, are three-dimensionally extended, part of the bonds can be disconnected in the c-axis direction. Due to the disconnection, for electrons to transfer again in the c-axis direction, there is no other than to detour the layer not containing nitrogen in the AO structure. Therefore, the present inventors have surmised that the electron transfer distance can be lengthened and the insulation properties of the metal oxynitride can be improved as compared with the case where the AO structure is not introduced. In other words, mere excessive contents of the A site element and oxygen in the metal oxynitride is not sufficient to improve the insulation properties of the metal oxynitride, and in addition, the above-mentioned AO structure needs to be introduced in the metal oxynitride.

Moreover, since the electron transfer pathway in a specific direction is inhibited without reducing the bond between the B site atoms and nitrogen which are responsible for the high dielectric properties, the metal oxynitride thin film having both good insulation properties and high dielectric properties can be obtained.

In particular, excellent insulation properties can be obtained even when the electric field strength applied to the metal oxynitride thin film becomes strong. This is because the bond between the B site atom and nitrogen is physically disconnected by incorporating the AO structure, so the effect of inhibiting the electron transfer pathway does not change so much. In other words, the metal oxynitride thin film of the present embodiment can maintain excellent insulation properties even under high electric field strength.

Since the electric field strength is proportional to the applied voltage, the fact that the metal oxynitride thin film of the present embodiment exhibits excellent insulation properties under a high electric field strength leads to an increase of a rated voltage of the capacitor element including the metal oxynitride thin film. Therefore, for example, such a capacitor element has an advantage that it can be used even when a high voltage exceeding the rated voltage of the conventional capacitor element is applied.

In addition, the above effect can be enhanced when the AO structure is scattered in the perovskite structure.

The characteristic configuration of the present embodiment will be appended below.

(Appended Note 1)

A metal oxynitride thin film having a perovskite structure, in which the metal oxynitride thin film has a composition represented by a compositional formula $A_{1+\alpha}BO_{x+\alpha}N_y$, wherein α is larger than zero and 0.300 or less, x+α is larger than 2.450, and y is 0.300 or more and 0.700 or less, and a product of a relative dielectric constant of the metal oxynitride thin film measured at an electric field strength of 0.5 Vrms/μm and a frequency of 1 kHz and a specific insulation resistance of the metal oxynitride thin film measured at the electric field strength of 0.5 V/μm is $2.0 \times 10^{13}$ Ωcm or more.

Although the embodiment of the invention has been described above, the invention is not limited thereto, and modifications may be made in various modes within the scope of the invention.

EXAMPLE

The invention will be described in more detail referring to the examples hereinafter, however, the invention is not limited thereto.

Experiment 1

First, $SrCO_3$ and $Ta_2O_5$ were prepared as target materials for the film formation material. They were weighed in Sample Nos. 1, 2, and 5 so that a ratio of Sr and:Ta is 1.1:1.0, and in Sample Nos. 3 and 4 so that a ratio of Sr and Ta is 1.0:1.0. Materials after weighing were mixed with ethanol as a solvent in a wet ball mill for 16 hours. The obtained mixed slurry was dried at 80° C. for 12 hours in a constant temperature drier. The obtained mixture was lightly crushed in a mortar, and then placed in a ceramic crucible and heat treated in an electric furnace at 1,000° C. for 2 hours in an air atmosphere to obtain a calcined material.

The obtained calcined material was pulverized with a wet ball mill for 16 hours together with ethanol as a solvent, and the pulverized slurry was dried at 80° C. for 12 hours in the constant temperature drier to obtain a pulverized product. To the pulverized product thus obtained, a polyvinyl alcohol solution as a binder was added in an amount of 0.6 wt % in terms of solid in the solution, mixed thereof and obtained a granulated product. The granulated product was pressed into a cylindrical shape having a diameter of about 23 mm and a height of about 9 mm to obtain a green compact. The green compact was fired in an electric furnace at 1400° C. in an air atmosphere for 2 hours to obtain a sintered body. The upper and the lower surfaces of the obtained sintered body were mirror polished to obtain a film-forming target having a 5 mm height sintered body. The relative density of the target obtained was 80% for Sr:Ta=1.1:1.0, and 95% for Sr:Ta=1.0:1.0.

The target for film formation obtained as described above was set in a film forming apparatus and then an Si substrate having a Pt film as a lower electrode on the surface was placed so as to face the target. A metal oxynitride thin film was formed to have a thickness of 600 nm by a PLD method in which nitrogen radicals were introduced. As the atmosphere gas, a mixed gas of oxygen gas and nitrogen gas was used. The ratio of the partial pressure of oxygen gas and the same of nitrogen gas in the mixed gas was set to the value shown in Table 1.

From the X-ray diffraction pattern of the obtained sample, it was confirmed that the thin film was crystallized. For the obtained sample, the composition analysis in the depth direction by XPS was performed, and the composition of the thin film was measured. From the obtained results, α was calculated from the amount of A site atom (Sr) with respect to the amount of B site atom (Ta). Using the calculated a, x was calculated from the amount of oxygen contained in the thin film. The results are shown in Table 1. Subsequently, the relative dielectric constant and the specific insulation resistance of the obtained sample was evaluated.

The relative dielectric constant was evaluated as follows. First, Ag was vapor-deposited on the metal oxynitride thin film 13 of the obtained sample at a diameter of 100 μm to form the upper electrode. Subsequently, the AC voltage was applied to the sample having the upper electrode formed thereon so that the electric field strength applied to the sample was 0.5 Vrms/μm at a frequency of 1 kHz and a reference temperature of 25° C., and the electrostatic capacitance of the sample was measured. The relative dielectric constant (no unit) was then calculated from the measured electrostatic capacitance and the thickness of the metal oxynitride thin film as the dielectric. The results are shown in Table 1. For a reference, the relative dielectric constant when the electric field strength was 0.1 Vrms/μm was measured in the same manner. The results are shown in Table 1.

By using a digital ultra high resistance meter, R8340A manufactured by ADVANTEST Co., Ltd., a DC voltage was applied so that the electric field strength applied to the sample having the upper electrode was 0.5 V/μm and the specific insulation resistance was measured. The results are shown in Table 1. For reference, the specific insulation resistance when the electric field strength was 0.1 V/μm was measured in the same manner. The results are shown in Table 1.

Also, a product of the evaluated relative dielectric constant and the specific insulation resistance was calculated. The results are shown in Table 1.

TABLE 1

| | Metal Oxynitride Thin Film $A_{1+\alpha}BO_{x+\alpha}N_y$ | | | | | Film formation step Partial pressure ratio | Property | | | | |
|---|---|---|---|---|---|---|---|---|---|---|---|
| | | | | | | | Relative dielectric constant | Specific insulation resistance | Product of ε and specific insulation resistance | Relative dielectric constant | Specific insulation resistance |
| Sample No. | Element Type | | Content Amount | | | | ε at | [Ω cm] | | ε at | [Ω cm] |
| | A site | B site | α | x | y | $pO_2/pN_2$ | 0.5 Vrms/μm | at 0.5 V/μm | resistance | 0.1 Vrms/μm | at 0.1 V/μm |
| 1 | Sr | Ta | 0.050 | 2.750 | 0.500 | 2.0 | 1684 | 1.4E+10 | 2.4E+13 | 1684 | 1.6E+10 |
| 2 | Sr | Ta | 0.050 | 2.900 | 0.400 | 4.0 | 1002 | 4.3E+11 | 4.3E+14 | 1002 | 4.8E+11 |
| 3 | Sr | Ta | 0.000 | 2.750 | 0.500 | 2.0 | 2395 | 5.9E+04 | 1.4E+08 | 2395 | 5.9E+05 |
| 4 | Sr | Ta | 0.000 | 2.900 | 0.400 | 4.0 | 2160 | 5.3E+06 | 1.1E+10 | 2160 | 5.3E+07 |
| 5 | Sr | Ta | 0.050 | 2.750 | 0.500 | 1.0 | 2330 | 8.3E+06 | 1.9E+10 | 2330 | 8.3E+07 |

In the table, "aE + b" indicates "a × $10^b$".

As shown in Table 1, in Sample Nos. 1 and 2, it was confirmed that a thin film with the improved specific insulation resistance while maintaining high dielectric properties could be obtained by excessively containing SrO by "a" and making $pO_2/pN_2$ at the time of film formation larger than 1.0 in the metal oxynitride thin film represented by the composition formula $Sr_{1+\alpha}TaO_{x+\alpha}N_y$. This is probably because the above-mentioned AO structure was sufficiently introduced into the perovskite structure of the thin film, and the electron transfer path through the Ta—N chain was inhibited. It is conceivable that this corresponds to that the specific insulation resistance when the electric field strength is 0.5 V/μm is only approximately 10% lower than the specific insulation resistance when the electric field strength is 0.1 V/μm.

In contrast, in Sample Nos. 3 and 4, it was confirmed that the specific insulation resistance was low even if $pO_2/pN_2$ was increased at the time of film formation since excess SrO was not contained. This is probably because the excess SrO was not contained and the AO structure was not formed. This is considered to correspond to the fact that the specific insulation resistance when the electric field strength is 0.5 V/μm is reduced by one digit from the specific insulation resistance when the electric field strength is 0.1 V/μm.

In addition, in Sample No. 5, it was confirmed that the specific insulation resistance was low since $pO_2/pN_2$ at the time of film formation was 1.0, even if excess SrO was contained. This is probably because $pO_2/pN_2$ at the time of film formation in the PLD method was not so high as the AO structure was formed even if excess SrO was contained. This is considered to correspond to the fact that, despite of containing excess SrO, the specific insulation resistance when the electric field strength is 0.5 Wpm is reduced by one digit from the specific insulation resistance when the electric field strength is 0.1 V/μm. That is, although the Sample Nos. 1 and 5 have the same composition, the relative dielectric constant and the specific insulation resistance thereof were different. Thus, it was confirmed that the AO structure is introduced in the metal oxynitride thin film of Sample No.

1 and the AO structure is not introduced in the metal oxynitride thin film of Sample No. 5.

Experiment 2

BaCO$_3$, La(OH)$_3$ and TiO$_2$ were further prepared as target materials for the film formation material.

In Sample No. 6, a target for film formation was prepared in the same manner as in Experiment 1 except weighed so that a ratio of Sr and Ta is 1.2:1.0. Using the produced target for the film formation, a metal oxynitride thin film was formed by the sputtering method. As the atmosphere gas, a mixed gas of oxygen gas and nitrogen gas was used. The ratio of the partial pressure of oxygen gas and nitrogen gas in the mixed gas were set to the values shown in Table 2.

With respect to the obtained sample, the composition, the relative dielectric constant and the insulation resistance of the metal oxynitride thin film were evaluated by the same method as in Experiment 1. The results are shown in Table 2.

In Sample No. 7, a target for film formation was prepared in the same manner as in Experiment 1 except weighed so that a ratio of Sr and Ta is 1.05:1.0. Using the produced target for the film formation, a metal oxynitride thin film was formed under the same condition as in Sample No. 1. With respect to the obtained sample, the composition, the relative dielectric constant and the specific insulation resistance of the metal oxynitride thin film were evaluated by the same methods as in Experiment 1. The results are shown in Table 2.

In Sample No. 8, a target for film formation was prepared in the same manner as in Experiment 1 except weighed so that a ratio of Sr and Ta is 1.4:1.0. Using the produced target for the film formation, a metal oxynitride thin film was formed under the same condition as in Sample No. 1. With respect to the obtained sample, the composition, the relative dielectric constant and the specific insulation resistance of the metal oxynitride thin film were evaluated by the same methods as in Experiment 1. The results are shown in Table 2.

In Sample No. 9, a target for film formation was prepared in the same manner as in Experiment 1 except weighed so that a ratio of Ba and Ta is 1.2:1.0. Using the produced target for the film formation, a metal oxynitride thin film was formed under the same condition as in Sample No. 1. With respect to the obtained sample, the composition, the relative dielectric constant and the specific insulation resistance of the metal oxynitride thin film were evaluated by the same methods as in Experiment 1. The results are shown in Table 2.

In Sample No. 10, a target for film formation was prepared in the same manner as in Experiment 1 except weighed so that a ratio of La, Sr, Ti, and Ta is 0.2:0.9:0.2:0.8. Using the produced target for the film formation, a metal oxynitride thin film was formed under the same condition as in Sample No. 1. With respect to the obtained sample, the composition, the relative dielectric constant and the specific insulation resistance of the metal oxynitride thin film were evaluated by the same method as in Experiment 1. The results are shown in Table 2.

TABLE 2

| Sample No. | Metal Oxynitride Thin Film $A_{1+\alpha}BO_{x+\alpha}N_y$ | | | | | Film formation step Partial pressure ratio pO$_2$/pN$_2$ | Property | | |
|---|---|---|---|---|---|---|---|---|---|
| | Element Type | | Content Amount | | | | Relative dielectric constant ε at 0.5 Vrms/μm | Specific insulation resistance [Ω cm] at 0.5 V/μm | Product of ε and specific insulation resistance |
| | A site | B site | α | x | y | | | | |
| 6 | Sr | Ta | 0.150 | 2.450 | 0.700 | 0.2 | 1045 | 2.1E+08 | 2.2E+11 |
| 7 | Sr | Ta | 0.020 | 2.750 | 0.500 | 2.0 | 1273 | 7.0E+09 | 8.9E+12 |
| 8 | Sr | Ta | 0.300 | 2.750 | 0.500 | 2.0 | 1596 | 2.5E+10 | 4.0E+13 |
| 9 | Ba | Ta | 0.100 | 2.900 | 0.400 | 2.0 | 1980 | 8.8E+09 | 1.7E+13 |
| 10 | La: 0.2, Sr: 0.8 | Ti: 0.2, Ta: 0.8 | 0.05: Sr | 3.050 | 0.300 | 2.0 | 2021 | 7.6E+09 | 1.5E+13 |

In the table, "aE + b" indicates "a × 10 b".
In the table, the numbers in the columns of "A site" and "B site" indicate the molar ratio of each element.

From Table 2, it was confirmed that the same effect as in Experiment 1 can be obtained even when altering a or changing the elements constituting A and B. The composition of the metal oxynitride thin film of Sample No. 10 was La$_{0.2}$Sr$_{0.85}$Ti$_{0.2}$Ta$_{0.8}$S$_{3.055}$N$_{0.300}$.

EXPLANATION OF REFERENCES

1 . . . Thin film capacitor
  51 . . . Substrate
  52 . . . Lower electrode
  53 . . . Metal oxynitride thin film
  54 . . . Upper electrode
15 . . . Octahedrons
  11 . . . Oxygen
  12 . . . Nitrogen
  13 . . . B site element
  14 . . . A site element
25 . . . Sr$_2$TaO$_3$N
  21 . . . SrTaO$_2$N layer
  22 . . . SrO layer

What is claimed is:
1. A metal oxynitride thin film having a perovskite structure where octahedrons in which anions occupy six vertexes and a B site atom exists in a center share vertexes, wherein
  the metal oxynitride thin film has a composition represented by a compositional formula $A_{1+\alpha}BO_{x+\alpha}N_y$, wherein α is larger than zero and 0.300 or less, x+α is larger than 2.450, and y is 0.300 or more and 0.700 or less,
  an AO structure having a layered structure parallel to a plane perpendicular to a c-axis of the perovskite structure and having a composition represented by a general formula AO, and the AO structure is bonded with the perovskite structure and incorporated in the perovskite structure.

2. The metal oxynitride thin film according to claim 1, wherein the AO structure is scattered in the perovskite structure.

3. The metal oxynitride thin film according to claim 1, wherein
A is one or more selected from the group consisting of Ba, Sr, Ca, La, and Nd; and
B is one or more selected from the group consisting of Ta, Nb, W, and Ti.

4. The metal oxynitride thin film according to claim 2, wherein
A is one or more selected from the group consisting of Ba, Sr, Ca, La, and Nd; and
B is one or more selected from the group consisting of Ta, Nb, W, and Ti.

5. The metal oxynitride thin film according to claim 1, wherein
a product of
a relative dielectric constant of the metal oxynitride thin film measured at an electric field strength of 0.5 Vrms/μm and a frequency of 1 kHz and
a specific insulation resistance of the metal oxynitride thin film measured at the electric field strength of 0.5 V/μm
is $2.0 \times 10^{13}$ Ωcm or more.

6. The metal oxynitride thin film according to claim 2, wherein
a product of
a relative dielectric constant of the metal oxynitride thin film measured at an electric field strength of 0.5 Vrms/μm and a frequency of 1 kHz and
a specific insulation resistance of the metal oxynitride thin film measured at the electric field strength of 0.5 V/μm
is $2.0 \times 10^{13}$ Ωcm or more.

7. The metal oxynitride thin film according to claim 3, wherein
a product of
a relative dielectric constant of the metal oxynitride thin film measured at an electric field strength of 0.5 Vrms/μm and a frequency of 1 kHz and
a specific insulation resistance of the metal oxynitride thin film measured at the electric field strength of 0.5 V/μm
is $2.0 \times 10^{13}$ Ωcm or more.

8. The metal oxynitride thin film according to claim 4, wherein
a product of
a relative dielectric constant of the metal oxynitride thin film measured at an electric field strength of 0.5 Vrms/μm and a frequency of 1 kHz and
a specific insulation resistance of the metal oxynitride thin film measured at the electric field strength of 0.5 V/μm
is $2.0 \times 10^{13}$ Ωcm or more.

9. A process of producing the metal oxynitride thin film according to claim 1 comprising a step of forming the metal oxynitride thin film by depositing a metal oxynitride having a perovskite structure with a use of a film formation material, wherein
a raw material, in which a ratio of a molar amount of an A site element of the perovskite structure with respect to a molar amount of a B site element of the perovskite structure is greater than 1.00, is used as the film formation material,
a mixed gas comprising a nitrogen gas and an oxygen gas is used as an atmosphere gas in the step of forming the metal oxynitride thin film, and
a ratio of a partial pressure of the oxygen gas with respect to a partial pressure of the nitrogen gas is 0.2 or more.

10. The process of producing the metal oxynitride thin film according to claim 9, wherein
A is one or more selected from the group consisting of Ba, Sr, Ca, La, and Nd; and
B is one or more selected from the group consisting of Ta, Nb, W, and Ti.

11. A capacitor element comprising the metal oxynitride thin film according to claim 1.

* * * * *